US006313881B1

(12) United States Patent
Reinhart et al.

(10) Patent No.: US 6,313,881 B1

(45) Date of Patent: Nov. 6, 2001

(54) SIGNAL PROCESSING FOR A PICTURE SIGNAL

(75) Inventors: Wolfgang Reinhart, Tengen; Carlos Correa, Villingen-Schwenningen; Dimitri Croise, Villingen-Schwenningen; Rainer Zwing, Villingen-Schwenningen, all of (DE)

(73) Assignee: Deutsche Thomson-Brandt GmbH, Villingen-Schwenningen (DE)

( * ) Notice: Subject to any disclaimer, the term of this patent is extended or adjusted under 35 U.S.C. 154(b) by 0 days.

(21) Appl. No.: 09/197,959

(22) Filed: Nov. 20, 1998

(30) Foreign Application Priority Data

Nov. 21, 1997 (DE) .............................................. 197 51 719

(51) Int. Cl.[7] ..................................................... H03M 1/12

(52) U.S. Cl. .......................... 348/572; 348/537; 341/155; 375/355

(58) Field of Search .................................... 348/537, 607, 348/625, 572, 700, 701, 407.1, 399.1; 375/355; 341/155, 144

(56) References Cited

U.S. PATENT DOCUMENTS

| | | | | |
|---|---|---|---|---|
| 4,872,054 | | 10/1989 | Gray et al. | 358/140 |
| 5,031,118 | | 7/1991 | Morizot | 364/521 |
| 5,493,317 | | 2/1996 | Kim | 345/213 |
| 5,539,473 | * | 7/1996 | Kommrusch et al. | 348/537 |
| 5,600,320 | * | 2/1997 | Wilson et al. | 341/144 |
| 5,764,302 | | 6/1998 | Park | 348/542 |
| 5,847,701 | * | 12/1998 | Eglit | 345/204 |
| 5,870,591 | * | 2/1999 | Sawada | 395/555 |
| 5,990,968 | * | 11/1999 | Naka et al. | 348/537 |
| 6,097,444 | * | 8/2000 | Nakano | 348/537 |
| 6,166,775 | * | 12/2000 | Fukuda | 348/537 |

FOREIGN PATENT DOCUMENTS

| | | | |
|---|---|---|---|
| 4409672A1 | 9/1995 | (DE) | H04N/11/20 |
| 19520281A1 | 12/1996 | (DE) | H04N/9/64 |
| 0707300 | 4/1996 | (EP) | G09G/1/16 |
| 0483467 | 5/1992 | (EP) | H04N/9/64 |

OTHER PUBLICATIONS

"Display Mode Detection for Multimode Monitors". In: IBM Technical Disclosure Bulletin, vol. 37, No. 04B, Apr. 1994, pp. 255–258.

German Search report translated into English citing the above–listed documents: AA, AB, AC, AM, AN, AR.

Article: "Low–Cost IC Provides Quality Video Conversion" by Paul McGoldrick—Electronic Design/Jul. 22, 1996.

*European Search Report* with references identified as AA,AM, AN and AR.

* cited by examiner

*Primary Examiner*—Reinhard J. Eisenzopf
*Assistant Examiner*—Trang U. Tran
(74) *Attorney, Agent, or Firm*—Joseph S. Tripoli; Robert D. Shedd; Frank Y. Liao

(57) ABSTRACT

A signal processing method for an analogue picture signal is proposed. In this case, the analogue picture signal originates from a computing unit (10) in which the signal was generated digitally in accordance with a graphics standard such as, for example, EGA or VGA and was subsequently converted into analogue form. The method consists in subjecting the analogue picture signal to analogue/digital conversion at a first chosen sampling frequency, after which the sampled picture is then investigated for picture disturbances, in order to determine a corrected sampling frequency. Further measures relate to the determination of the optimum sampling phase and the determination of the exact position of the active picture relative to the horizontal and/or vertical synchronization pulses.

13 Claims, 10 Drawing Sheets

SIGNAL PROCESSING FOR A PICTURE SIGNAL

BACKGROUND OF THE INVENTION

The invention relates to a signal processing method for an analogue picture signal.

The invention is based on a signal processing method for an analogue picture signal of the generic type of the independent Claim 1. The invention is concerned with the problem of displaying a picture originating from a computing unit (for example personal computer) on the screen of a television set. In other words, therefore, the intention is for a picture which has been generated by a computer in accordance with a set graphics standard (for example EGA, VGA or (S)VGA) to be output via a television set instead of a computer monitor. For this problem area, EP-A-0 697 689 has provided a multiplex unit which enables either the output signal of the computer or the TV video signal to be selected and fed directly to a monitor without any analogue/digital or digital/analogue conversion being carried out. In this case, therefore, use is made of a computer monitor which also has a mode in which standard TV signals can be displayed.

SUMMARY OF THE INVENTION

In a departure from the abovementioned prior art, the intention according to the present invention is for the screen of a television receiver to be used for the display of the computer-generated picture. If the television receiver is equipped with digital signal processing, e.g. for the known 100 Hz technology or for format matching (zoom function in the case of widescreen television receivers) the problem arises whereby the analogue picture signals coming from the personal computer have to be digitized for matching to the picture resolution and picture size of the television receiver. In order to be able to recover the original picture data as faithfully as possible to the original, the analogue picture signals should be sampled at the same frequency and as far as possible also with the same phase as they were originally generated in the graphics card of the personal computer. In other words, pixel-synchronous sampling should be performed.

The method according to the invention, having the features of Claim 1, solves the problem of sampling at the correct frequency in such a way that first of all analogue/digital conversion is carried out with a pre-set sampling clock pulse and then the picture stored in the process is investigated for picture disturbances in order to determine the correct sampling frequency.

This method enables the computer graphics signals of any desired standard to be reproduced on a TV receiver faithfully to the original.

Advantageous developments of the method are possible by virtue of the measures evinced in the dependent claims. It is advantageous for the investigation of the sampled picture for picture disturbances if the picture signal is divided into a number of sections (for example columns) and the pixel values in the individual sections are added. Afterwards, the same picture is sampled anew at a slightly altered sampling frequency and the pixel values (as before) are added anew in the individual sections. The difference between the summation values in the individual sections for the two sampling operations is then formed. The number of maxima and minima in the distribution of the difference values is counted. The result corresponds in practice to the picture disturbances that occur in the picture. The number of maxima and minima allows a conclusion to be drawn about the difference with regard to the optimum sampling frequency. After the corrected sampling frequency has been set, the operation can be repeated in order to verify that the optimum sampling frequency has been found.

Further specific, advantageous measures for the algorithm regarding the sampling frequency determination are specified in Claims 3 to 14. A very advantageous measure is the use of a table having the possible sampling frequencies for the known graphics standards in accordance with Claim 10. If none of the values stored therein has led to the desired result, it is advantageous if a further search operation is carried out such that, proceeding from the first sampling frequency in the table, the sampling frequency is progressively incremented by a defined value until the optimum sampling frequency has been found (see Claims 12 and 13). If this measure does not lead to the desired result either, the option still remains of varying the division of the picture line into sections and of starting the search anew.

The use of high-pass filtering before the investigation of the data of a sampled picture has the advantage that only the relevant frequencies in the picture are considered.

It is advantageous for the determination of the optimum sampling phase if, for the sampled picture, the absolute value of the difference between two successive pixel values is in each case summed, the sampling phase is progressively incremented or decremented, the sum of the pixel difference values for the picture is in each case calculated anew and then the maximum is determined in the distribution of the summation values for the different sampling phases. The phase setting associated with the maximum then specifies the optimum sampling phase value. The measures are evinced in Claim 16.

In order to achieve exact determination of the initially unknown horizontal and/or vertical position of the active picture to be displayed, it is advantageous, in accordance with Claim 18, if the inactive pixels at the edges of the picture to be displayed are counted. In accordance with Claim 19, the counting of the pixels at the left-hand or right-hand edge of the picture can take place in such a way that the picture is once again divided into a number of sections and the pixel values in the individual sections are added. The summation values are then compared with a threshold value in order to define which sections are filled with pixel values of the edge of the picture and which sections have pixel values of the computer picture to be displayed. The number of sections with summation values below the threshold value at the left-hand and right-hand edge of the picture is counted. Progressive shifting of the sections relative to the pixel values in one direction then takes place. The summation values are in each case determined anew for the new sections and a comparison is once again performed to see whether the summation values lie below the threshold value or now lie above the threshold value. As an alternative, it is also possible to ascertain whether a sum that was previously above the threshold value now lies below the threshold value. The number of pixels in the left-hand or right-hand edge region is then determined using the number of shifts by in each case one pixel and the number of sections with a sum below the threshold value at the beginning of the shifting operations. The exact determination of the position of the picture is required, for example, for subsequent centring of the picture on the screen of the television receiver.

BRIEF DESCRIPTION OF THE DRAWINGS

Exemplary embodiments of the invention are illustrated in the drawings and are explained in more detail in the description below. In the figures.

DESCRIPTION OF THE PREFERRED EMBODIMENTS

Figure 1:
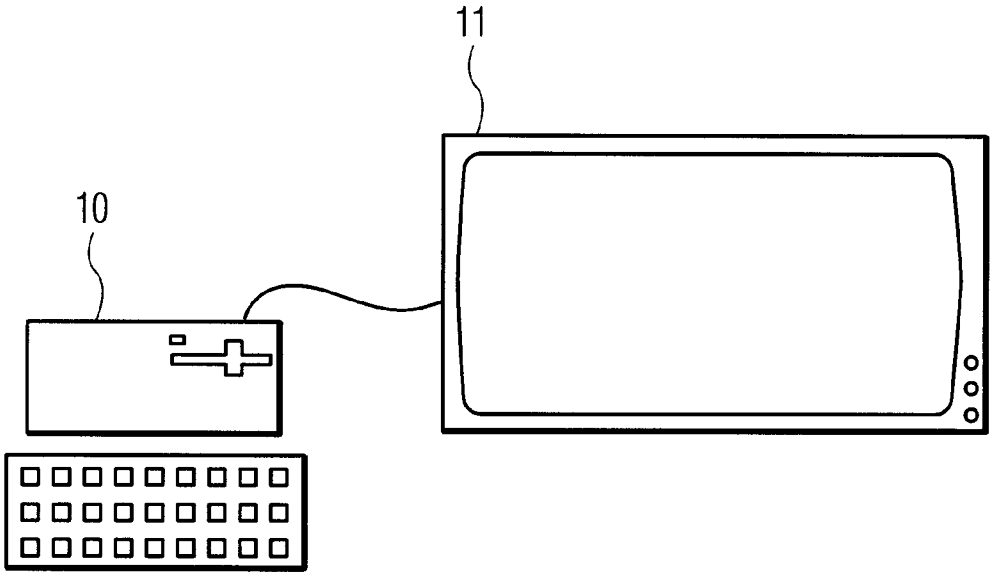
FIG. 1 shows a television receiver connected to a personal computer.

As already explained, the intention is for the graphics signals of a personal computer to be displayed on the screen of a television receiver. This arrangement is shown in FIG. 1. The personal computer is designated by the reference numeral 10. The personal computer is connected to the television receiver 11. The connection can be designed such that the RGB signals and the vertical and horizontal synchronization signals HSYNC and VSYNC are forwarded separately to the television receiver. It is assumed in this case that all the signals are transmitted in analogue form to the television receiver. The television receiver may be a conventional TV set having digital signal processing and a conventional picture tube. Alternatively, it may be a television receiver of a more recent type having a matrix display (for example plasma or LCD screen). In these cases, digitization of the analogue signals that are fed in is absolutely necessary.

Figure 2:
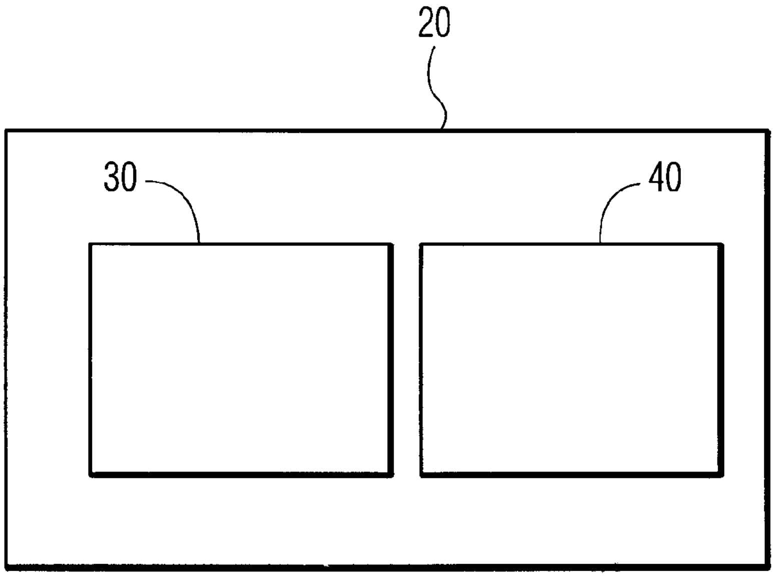
FIG. 2 shows a rough block diagram of a converter for the graphics signals of the personal computer.
Figure 3:
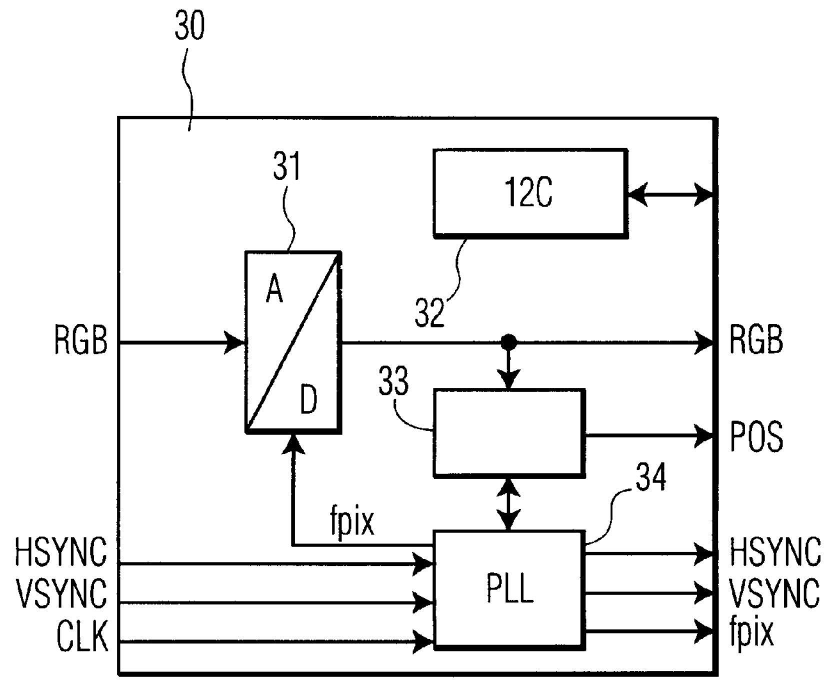
FIG. 3 shows a block diagram for the inventive sampling unit for sampling the picture signal in a manner that is correct in terms of frequency and phase.

The converter circuit which performs the sampling and processing of the incoming analogue RGB and synchronization signals is designated by the reference numeral 20 in FIG. 2. It essentially contains the two blocks of sampling unit 30 and format conversion unit 40. The sampling unit 30 is illustrated in more detail in FIG. 3. The reference numeral 31 designates an A/D converter. The analogue RGB signals are fed on the input side to this converter. The digital RGB signals are present at the output of the A/D converter 31. These digital RGB signals are forwarded to the RGB output of the sampling unit 30, on the one hand, and to the detection unit 33, on the other hand. The function thereof consists in determining the optimum frequency and sampling phase and, on the other hand, ascertaining the exact position of the transmitted picture relative to the synchronization signals HSYNC and VSYNC. The position information is forwarded by the detection unit 33 to the output POS of the sampling unit 30. The optimum frequency and sampling phase are transferred to a PLL circuit 34, which accordingly generates the optimized sampling clock pulse. The synchronization signals HSYNC and VSYNC and also an external clock signal CLK are additionally fed to the PLL circuit 34.

The synchronization signals and also the optimized sampling clock pulse $f_{pix}$ are forwarded to corresponding outputs of the sampling unit 30. The function of the PLL circuit 34 is sufficiently known in the prior art and, therefore, need not be explained in any further detail here. The function of the detection unit 33 will be explained in more detail below. The sampling unit 30 additionally has an interface circuit 32, which serves, for example, as interface for the $I^2C$ bus that is in widespread use. Via this interface circuit, commands from an external microcomputer can then be received and the corresponding settings can be performed in the sampling unit 30.

Figure 4:
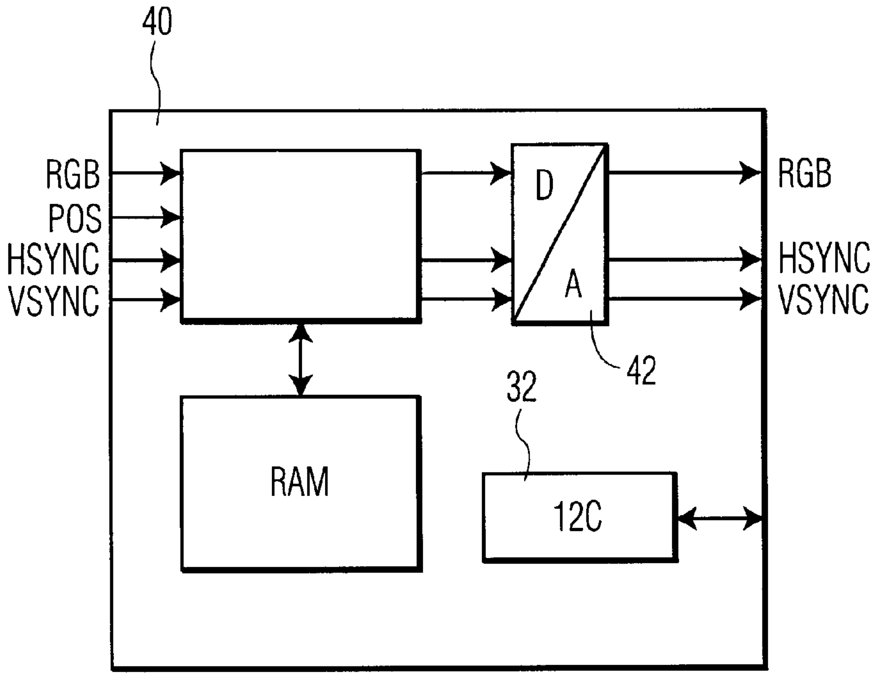
FIG. 4 shows a block diagram for the format matching of the picture to be displayed.

According to FIG. 4, the picture processing unit 40 has a polyphase filter unit 41. Format matching of the received computer picture for the outputting on the television screen takes place, for example, in this polyphase filter unit. In this case, for example, zoom operations in the horizontal and vertical directions can be carried out in order, for example, to convert a computer picture having the aspect ratio 4:3 into a television picture having the aspect ratio 16:9. The requisite filter arrangements and/or algorithms are likewise known from the prior art and, therefore, need not be explained in any further detail for this invention. It may additionally be mentioned, however, that the picture is centred in accordance with the received position information via the POS input.

For the format matching, the digital RGB signals are buffer-stored in the frame store 43. With regard to the synchronization signals HSYNC and VSYNC present at the input, it may additionally be mentioned that they are converted in the polyphase filter unit 41 in such a way that they correspond to the synchronization signals for standard TV signals. During the subsequent outputting of the picture, the format-matched RGB data and synchronization signals are forwarded to the D/A conversion unit 42, where they are converted into analogue signals which then serve to drive the picture tube of the television receiver.

If the television receiver has a matrix display instead of a conventional picture tube, this D/A conversion unit 42 can be omitted, if appropriate. The picture processing unit 40 likewise has an interface circuit 32 for connection to external modules, such as, in particular, microprocessors.

Figure 5:
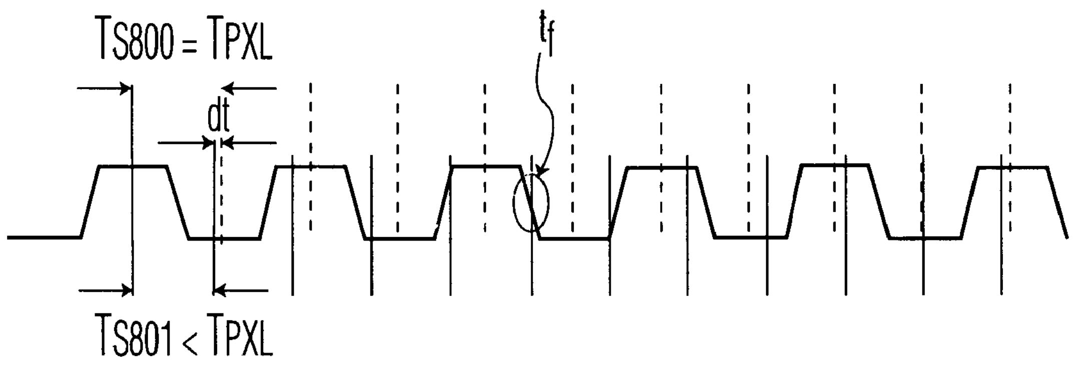
FIG. 5 shows an illustration for clarifying the effect which arises if a picture signal is sampled at a slightly incorrect sampling frequency.

FIG. 5 illustrates a portion of a picture signal. The picture content transmitted thereby is by way of a model and corresponds in practice to the highest video frequency that occurs, that is to say to a picture which is successively composed of black and white pixels. The known VGA (Video Graphics Array) graphics cards generate pictures having 640*480 pixels. There are also so-called Super VGA graphics cards, however, which generate pictures having an even higher resolution. The resolutions of 800*600 pixels and 1024*768 pixels may be mentioned as examples. The VGA standard only stipulates that the active region of the picture line has 640 pixels. A picture line including the inactive part (blanking interval) can have, for example, 800, 808 or 816 pixels, depending on the graphics card manufacturer.

The broken lines in FIG. 5 mark the optimum sampling points for the picture signal illustrated. The solid vertical lines mark instead the actual sampling points for the set sampling frequency. In this case, it has been assumed by way of a model that the sampling frequency is not set accurately enough that 800 pixels are generated, rather that instead the sampling frequency is set slightly incorrectly, with the result that 801 pixels are sampled. The sampling period TS801 is consequently shorter than the optimum sampling period TS800. The difference value dt results as the difference. It can clearly be seen in FIG. 5 that at the sampling instant $t_F$, sampling is effected in the transition region between two pixels. This leads to a corrupted sampling operation since the white value is not sampled, rather any grey-scale value or, during the subsequent sampling, even a black value is sampled instead.

Figure 6:
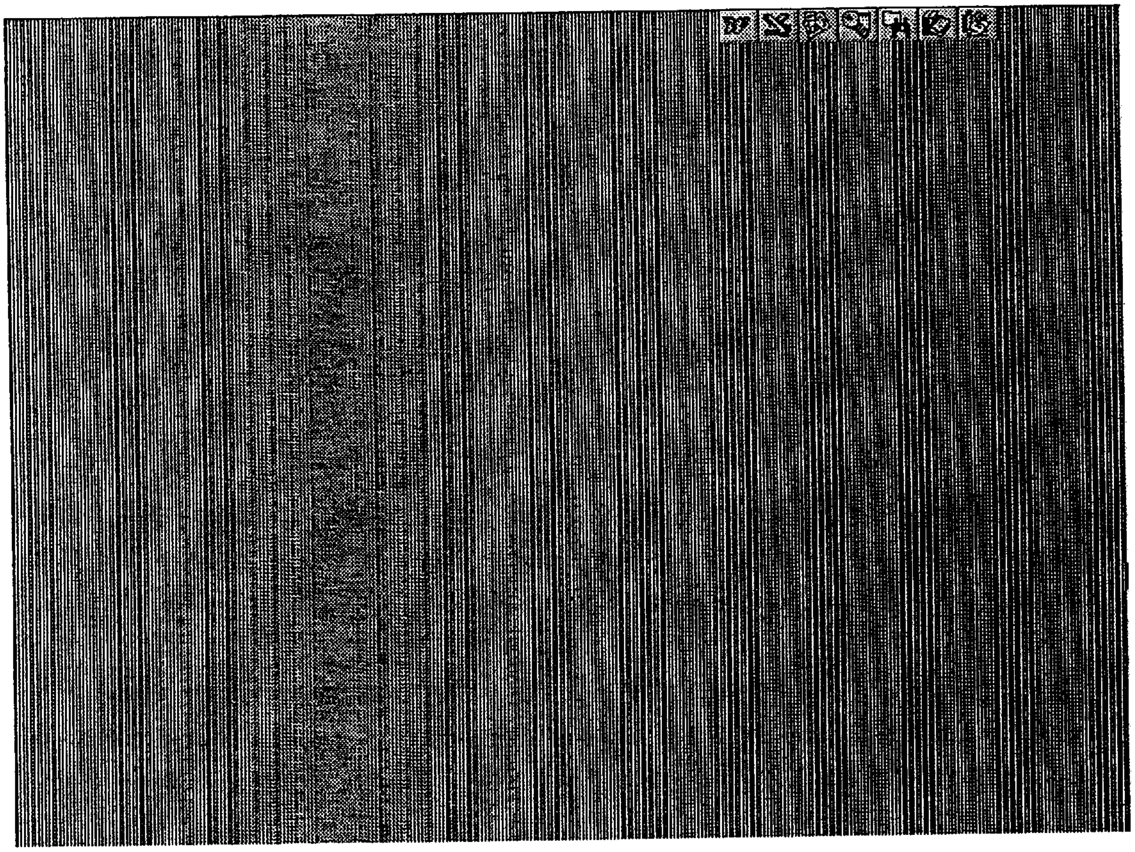
FIG. 6 shows a specimen picture with a disturbed picture area, caused by a slightly incorrectly chosen sampling frequency.

A picture disturbance is therefore caused in the picture. This can be seen in FIG. 6, which illustrates, for a real VGA picture having 640*480 pixels, the picture disturbance that occurs when sampling is instead effected at a sampling frequency which samples 801 pixels per line in the same time period. If the sampling frequency differs from the generation frequency such that the sampling operation produces n pixels more (or fewer) than were generated, precisely n areas with disturbances are produced in the picture. This effect is utilized in the method for automatic setting of the optimum sampling frequency.

Figure 7:
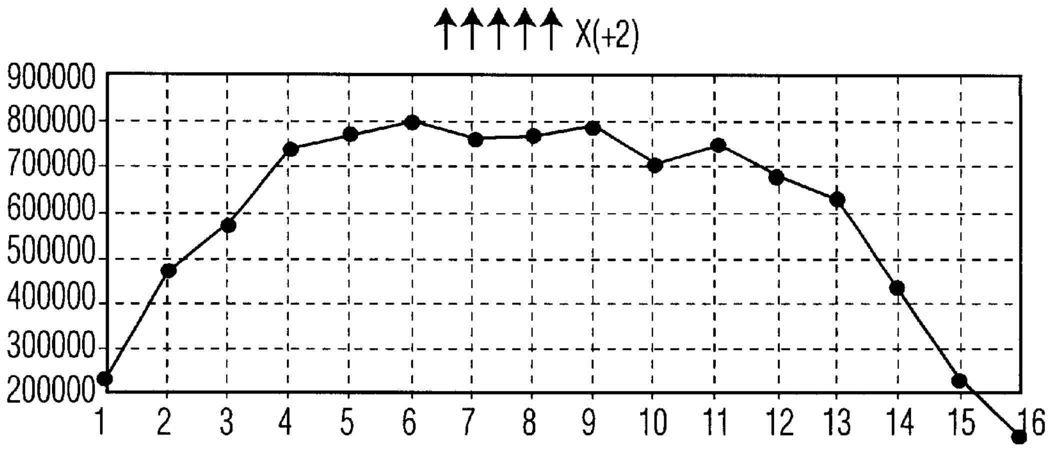
FIG. 7 shows a distribution of the summation values for the different sections of a picture signal which has been sampled at a first sampling frequency.
Figure 8:
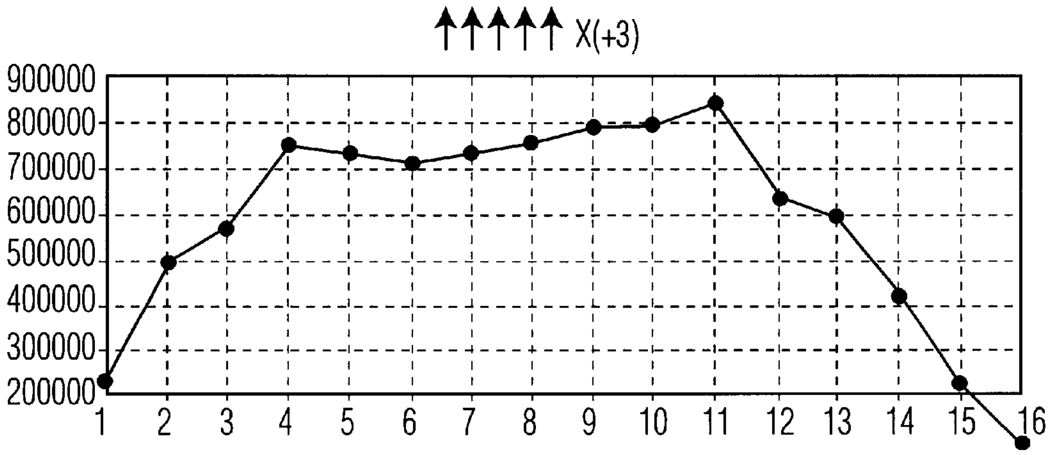
FIG. 8 shows a distribution of the summation values for the different sections of a picture signal which has been sampled at a second sampling frequency.

In order, in the case of a sampled picture, to be able to draw a conclusion about the frequency at which the pixels have been generated, the picture must be investigated for the said picture disturbances. For this purpose, the picture is divided into sections, for example into columns. The number of sections depends on the desired resolution (the identifiable frequency deviation is meant) and the outlay that can be provided for this detection. It has emerged that the division of the picture into 16 columns seems to be a good compromise for these requirements. The method for ascertaining the optimum sampling frequency then proceeds as follows:

After high-pass filtering, the pixel values of the sampled picture are summed in each case per section. This operation applies to two differently set sampling frequencies. The result of these summations in the sections is illustrated in FIGS. 7 and 8. The section numbers (corresponding to the horizontal extent of the picture) are plotted on the abscissa. In this case, FIG. 7 shows the result for a picture which has been sampled such that 802 pixels have been generated even though the actual computer picture was generated in each case with 800 pixels. FIG. 8 shows, on the other hand, the result for the same picture but with the picture signal having been sampled in the active picture area at a sampling frequency which generated 803 pixels per line. The results of the summations in the individual sections are represented on the ordinate. The values for the individual sections are marked by the rhomboid symbols.

Figure 9:
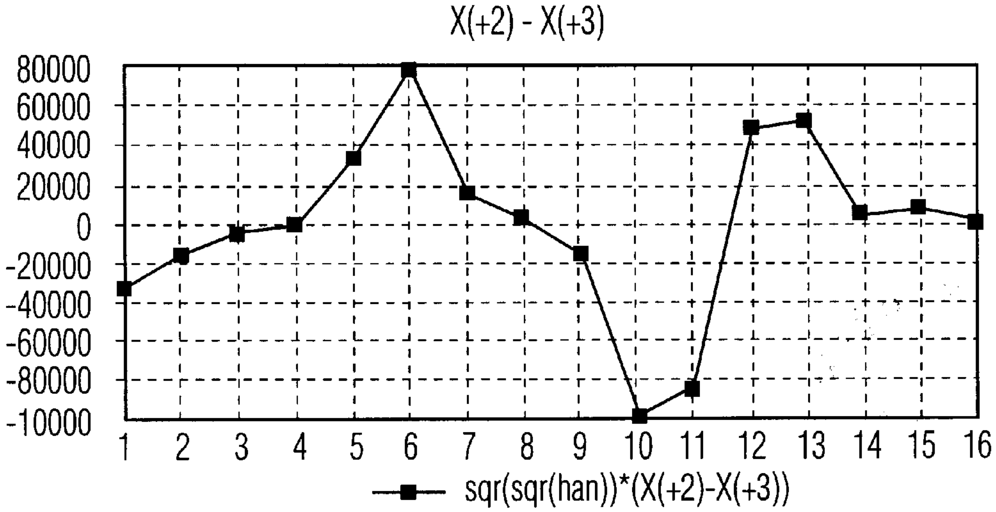
FIG. 9 shows an illustration for the difference values between the summation values in accordance with the distributions of the summation values according to FIGS. 7 and 8.

In order to separate the picture disturbances from the correctly sampled picture sections, these values of the two differently sampled pictures are subtracted from one another in a following step. The result of this subtraction is illustrated in FIG. 9. The section numbers (column numbers) are again specified on the abscissa and the resultant difference values are plotted on the ordinate. A maximum in the region of column 6 and a further maximum in the region of column 13 and also a minimum at column 10 are clearly discernible. In FIG. 9, the picture disturbances of the picture sampled with 803 pixels can be discerned as local maxima and those of the picture sampled with 802 pixels can be discerned as local minima. Accordingly, three maxima and two minima should be detectable in FIG. 9. However, since the disturbances that occur are distributed throughout the entire picture line (not just the active part of the picture line), the missing disturbed regions that are not visible occur in the blanking interval outside the active picture. During the blanking interval, it is actually impossible for sampling to be incorrect, therefore the disturbances that occur are not visible there. Nevertheless, evaluation of FIG. 9 permits the conclusion to be drawn that the first sampling of the picture has been carried out at a lower frequency than the second sampling and that the optimum sampling frequency must still lie below the sampling frequency in the case of the first sampling. Accordingly, a lower sampling frequency can be set as corrected sampling frequency.

It is possible to infer the correct sampling frequency directly in a small region by evaluation of the corresponding curve in accordance with FIG. 9. Unfortunately, this functions in this way only in a relatively small region. This region comprises a deviation of up to approximately 7 pixels per line. Even though the exact number of maxima and minima cannot be detected, it is still possible to move with the frequency in the correct direction in the case of which fewer picture disturbances occur. If the frequency in the case of the first sampling is relatively far removed from the optimum sampling frequency, it is possible to jump with the sampling frequency in steps of, for example, ±5 pixels per line and to use these results to determine the direction in which the original generation frequency must have been situated.

Figure 10:
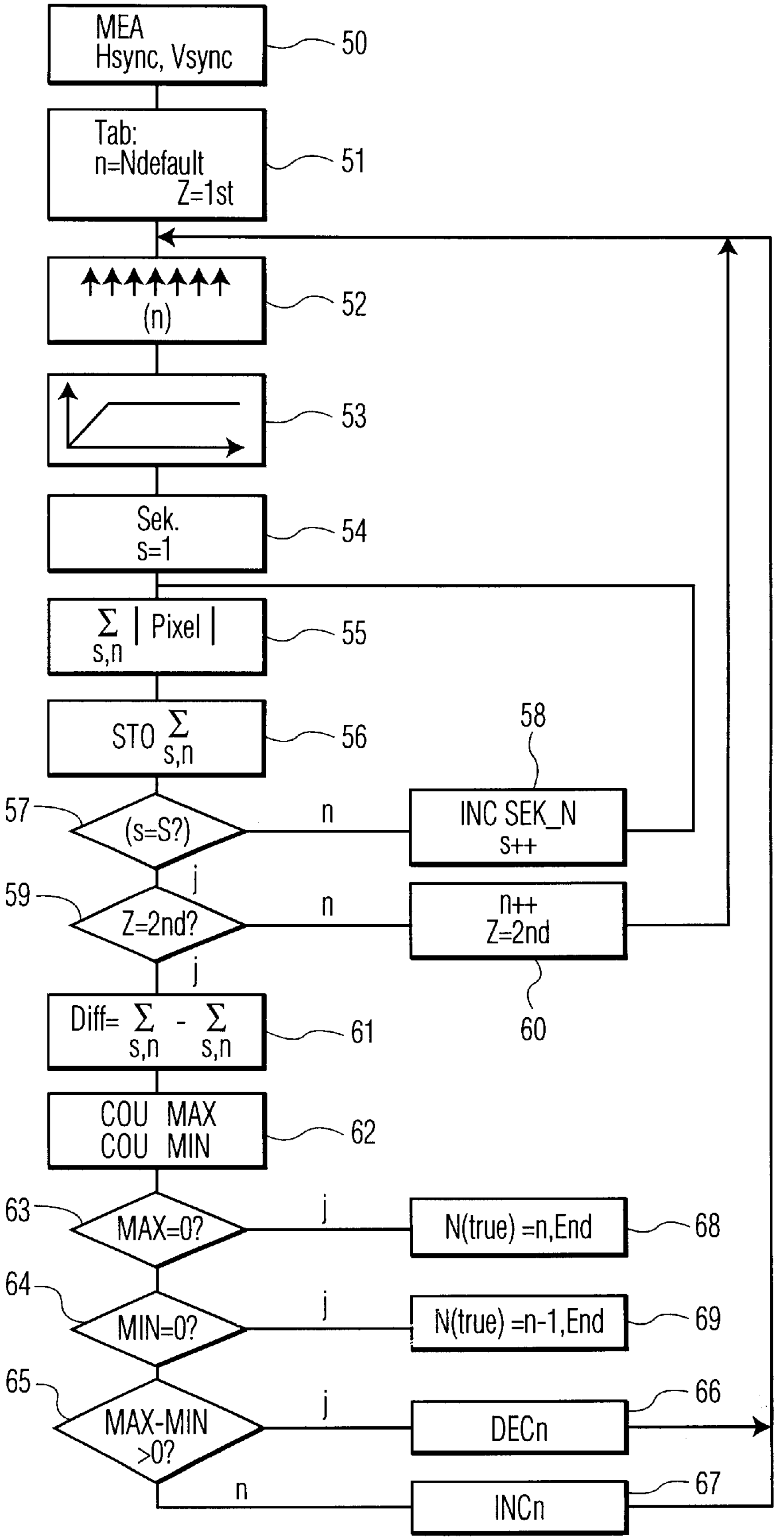
FIG. 10 shows a first flow diagram for the determination of the optimum sampling frequency.

FIG. 10 illustrates a first flow diagram for the method for determining the original generation frequency. The method begins with the detection of the falling edge of the horizontal and/or vertical synchronization signal in step 50. If this has been identified, a start value Ndefault for the desired number n of pixels per line is fixed in step 51. A state variable Z in the first state 1st is likewise set. The sampling operation of the picture in accordance with the sampling frequency chosen then takes place in step 52. High-pass filtering is carried out in step 53. A variable s is set to the value 1 in step 54. The variable specifies the section number (column number). The summation of the pixel values of the individual sections takes place in step 54. In step 56, the summation values obtained for the individual sections and for the sampling frequency are stored in the memory. In interrogation 57, a check is then made to see whether or not the variable s for the section number has already reached the final value S. If not, the variable s is incremented in step 58. The method is then resumed again with step 55. If it is identified in interrogation 57 that the summation has been carried out in all sections, a check is made in interrogation 59 to see whether or not the state variable Z has already reached the state 2nd. If not, in step 60 a slightly increased sampling frequency is set and the state variable Z is set to the second state 2nd. Steps 52 to 59 are then repeated. In step 61, the difference between the summation results of the two sampling operations in accordance with FIG. 9 is then formed. The maxima and minima in the resultant distribution of the difference values are then counted in step 62. In interrogation 63, a check is then made to see whether no maximum has even been identified. If that is not the case, a check is made in interrogation 64 to see whether no minimum has even been identified. If that is not the case either, a check is made in interrogation 65 to see whether the number of maxima counted is greater than the number of minima counted. If that is the case, the variable n for the number of pixel values to be generated is decremented. The procedure with steps 52 to 65 is then repeated. If it is ascertained in interrogation 65 that the number of minima is greater than the number of maxima, the variable n for the generation of the pixels per line is incremented in program step 67. The method is then likewise continued in step 52. The method is continued until either it has been identified in interrogation 63 that a maximum could no longer be determined or that no local minimum could be identified in interrogation 64. Then, in step 68, the current value of the variable n is output as optimized sampling frequency and the method is ended. Or, in step 69, the current value of the variable n reduced by one is output as optimum value for the variable n and the program is ended.

Figure 11:
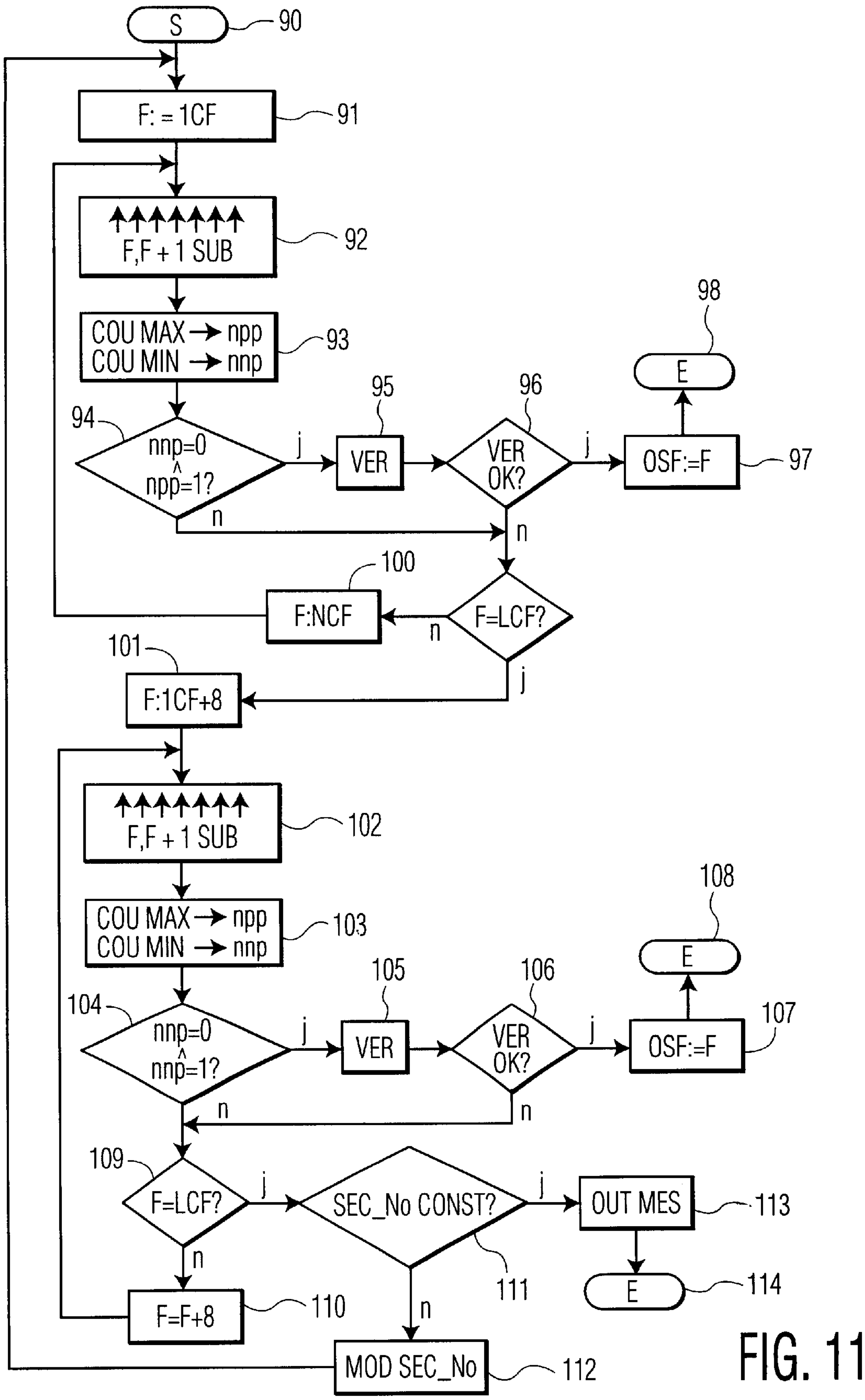
FIG. 11 shows a second flow diagram for the determination of the optimum sampling frequency.

FIG. 11 additionally illustrates a second detailed flow diagram for the method for determining the original generation frequency. The start of the associated program begins in program step 90. In program step 91, the first entry is selected from the table for the sampling frequencies considered and is set as the sampling frequency. In the next program step, the sampling operation for the selected frequency then takes place and, in addition, the distribution of the summation values for the individual columns in the picture line is again determined. In addition, the selected sampling frequency is incremented, with the result that one pixel more per picture line is generated. The sampling operation is then repeated and the distribution of the summation values for the individual columns is likewise formed. The difference is again calculated. In the next program step 93, the determination of the clear-cut maxima and minima in the distribution of the difference values then again takes place. In interrogation 94, a check is then made to see whether the number of maxima is equal to 1 and the number of minima is equal to 0. If that is the case, in program step 95 it is verified whether the optimum sampling frequency has actually been found. To that end, a sampling operation is carried out anew, to be precise with differently set sampling phases. The counting of the maxima and minima must lead to the same result again for at least two differently set sampling phases, as prescribed in step 94. This is checked in interrogation 96. If the abovementioned condition is true, then the sampling frequency of the first entry in the table is set as the optimum sampling frequency in step 97. The program then ends with step 98.

If the result of interrogation 96 is such that the optimum sampling frequency could not be verified, interrogation 99 is carried out next. This also applies when the interrogation condition was decided negatively in interrogation 94. An interrogation is then performed in interrogation 99 to see whether the last sampling frequency considered in the table had already been set. If not, the next frequency considered is selected from the table and set as the sampling frequency in program step 100. The program is then continued again with program step 92. If interrogation 99 revealed that the last sampling frequency from the table had, in actual fact, already been set, then a sampling frequency which is increased by an increment relative to the first stored sampling frequency in the table is set as the new sampling frequency in program step 101. This increment value is chosen such that 8 pixels more per picture line are generated compared with the unchanged sampling frequency value. This value follows from the fact that the graphics card manufacturers have chosen the setting registers for the generation frequencies in such a way that the generation frequency can be altered only in these increment steps. Afterwards, in program step 102, renewed sampling then takes place at the set sampling frequency and the distribution of the difference values for the sampling frequencies F and F+1 is again determined. The number of maxima and minima is again determined in program step 103. A new check is made in interrogation 104 to see whether only one maximum and no minimum have occurred. If this was the case, verification of the set sampling frequency F again takes place in program step 105. This proceeds in exactly the same way as in program step 95. Interrogation 106 corresponds to interrogation 96. Program steps 107 and 108 then correspond to program steps 97 and 98 and need not be explained again here. If the set sampling frequency could not be verified as the optimum sampling frequency or if a negative result was already determined in interrogation 104, the program is continued with interrogation 109, in which an interrogation is performed to see whether the last possible sampling frequency for the various graphics standards has been set. If that was not the case, the set sampling frequency is increased by the incremental value in program step 109. The program is then continued in program step 102. If the interrogation result in interrogation 109 was positive, an additional check is made in interrogation 111 to see whether the division of the picture line into sections has already been altered. If that was not yet the case, this is performed in program step 112. What is then avoided as a result of this is the situation where specific structures in the picture, such as, for example, a displayed grid with repeating grid cells, has made it impossible to find an optimum sampling frequency. After a new division into sections has been chosen, the program is then repeated starting from program step 91. If this measure does not lead to the optimum sampling frequency either, then, finally, a corresponding message is output on the screen in program step 113. This can be an error message, for example. The program then ends in program step 114.

One possible table having the different sampling frequency values for the known graphics standards is additionally illustrated below. The values in the table each specify how many pixels per picture line are generated by the sampling frequency.

TABLE

| VGA | SVGA | SVGA | SVGA |
|---|---|---|---|
| 792 | 936 | 1152 | 1248 |
| 800 | 960 | | 1264 |
| 816 | 980 | | 1280 |
| 824 | 1008 | | 1296 |
| 832 | 1024 | | 1304 |
| 840 | 1032 | | 1312 |
| 848 | 1040 | | 1328 |
| 856 | 1048 | | 1336 |
| 864 | 1056 | | 1344 |
| 880 | 1088 | | 1352 |
| | 1096 | | 1376 |
| | | | 1472 |

Figure 12:
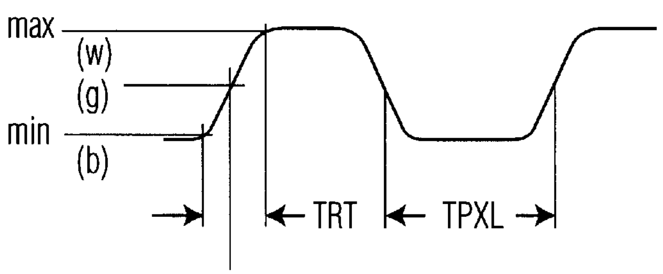
FIG. 12 shows an illustration of a picture signal.
Figure 13A:
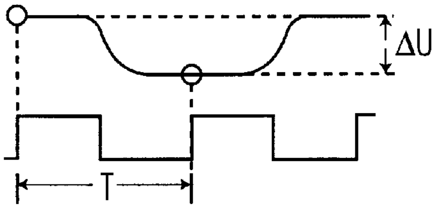
FIG. 13*a* shows an illustration for the sampling of a video signal with a first sampling phase.
Figure 13B:
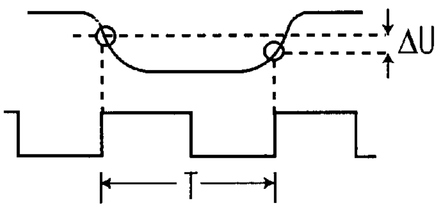
FIG. 13*b* shows the illustration of a sampling operation of a video signal with a second sampling phase.

The setting of the optimum sampling phase is discussed in more detail below. Phase detection or optimization thereof is practical only when the frequency at which the pixels were generated is determined. The phase must then also be detected because if the sampling phase is set incorrectly, it can happen that the pixel values are not correctly recovered. This applies particularly with graphics signals generated by a computer, since these signals can have very steep transitions between the individual pixels. FIG. 12 illustrates an exemplary picture signal. The reference symbol $T_{PXL}$ specifies the signal duration for a pixel. Sampling in the region of the rising edge of the picture signal must inevitably lead to erroneous values. The associated rise time is designated by the reference symbol $T_{RT}$. FIG. 13 illustrates that the difference $\Delta U$ between two successive samples depends on the sampling phase. In FIG. 13*a*, the sampling clock pulse is such that sampling is effected precisely in the centre of a pixel. The sampling clock pulse is illustrated in the lower part of FIG. 13*a*. Sampling is effected in each case on the occurrence of the rising edge of the sampling clock pulse. In FIG. 13*b*, the sampling clock pulse is shifted precisely through 180° relative to FIG. 13*a*. Now, sampling is no longer effected in the centre of a pixel but rather in the transition regions to the next pixel value. The difference between the two successive samples $\Delta U$ is in this case much smaller than in FIG. 13*a*. It can additionally be discerned from the two figures that the difference between two successive samples is maximal given optimum sampling (sampling in the centre of a pixel is meant). It is precisely these facts that are utilized in the method that is used here for the determination of the optimum sampling phase. For this purpose, the method theoretically requires at least one horizontal transition in the picture. A horizontal transition is understood to mean the changing of the pixel value from one pixel to the next. Since, under certain circumstances, this is not the case in every line in many pictures (for example when a horizontal line occurs in the picture), the differences between two successive pixels must be summed, in terms of absolute value, as far as possible over the entire picture. The result of this summation affords a relative statement about the phase with which sampling was effected.

However, this value depends not only on the phase but also to a considerable extent on the picture content. Therefore, in the method according to the invention, only values which have been generated with the same picture content are compared with one another. Instead of forming the difference between two successive pixels, it is also possible to employ a high-pass filter. This then has the advantage, for example, that a reduction of the gain of the filter means that the absolute values after summation become significantly smaller. In addition, particular difference variables can be weighted more heavily than others. The formula for the summation of the difference values is specified below.

$$\phi_I = \sum_{n=1}^{P_{Tot}-1} |P_{n+1} - P_n|$$

Figure 14:
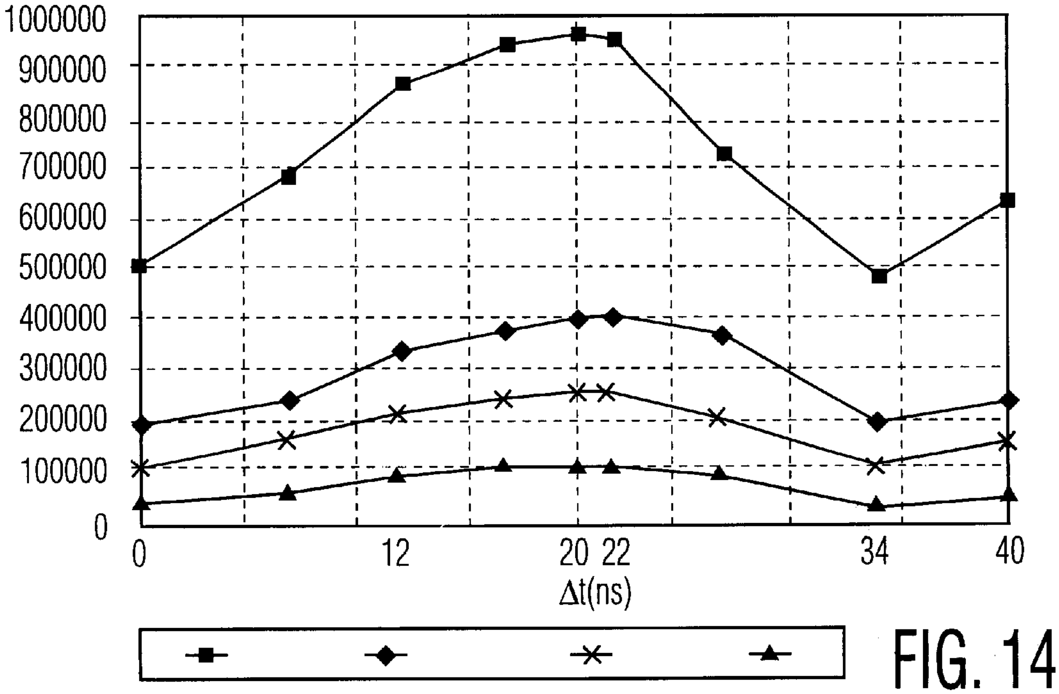
FIG. 14 shows an illustration for elucidating the principle for ascertaining the optimum sampling phase.

In the method for determining the sampling phase, the summation of the difference values is carried out a number of times for differently set phases in the case of a picture. The phase at which the largest summation value is produced is the best possible phase setting. In order to detect the optimum phase more accurately, it is possible to use an optimization method which converges towards the maximum. FIG. 14 illustrates the summation results for different phases for various picture originals. The different phase values range from 0 to 40 ns, which corresponds to a pixel period if the pixels are generated with a 25 MHz clock. The set phase is respectively plotted on the abscissa by specification of the delay value in ns. Even in the case of the Hellbender original picture, which has only few clear horizontal transitions, the maximum in the distribution can still readily be determined and the optimum phase value can be ascertained at approximately 20 ns.

Figure 15:
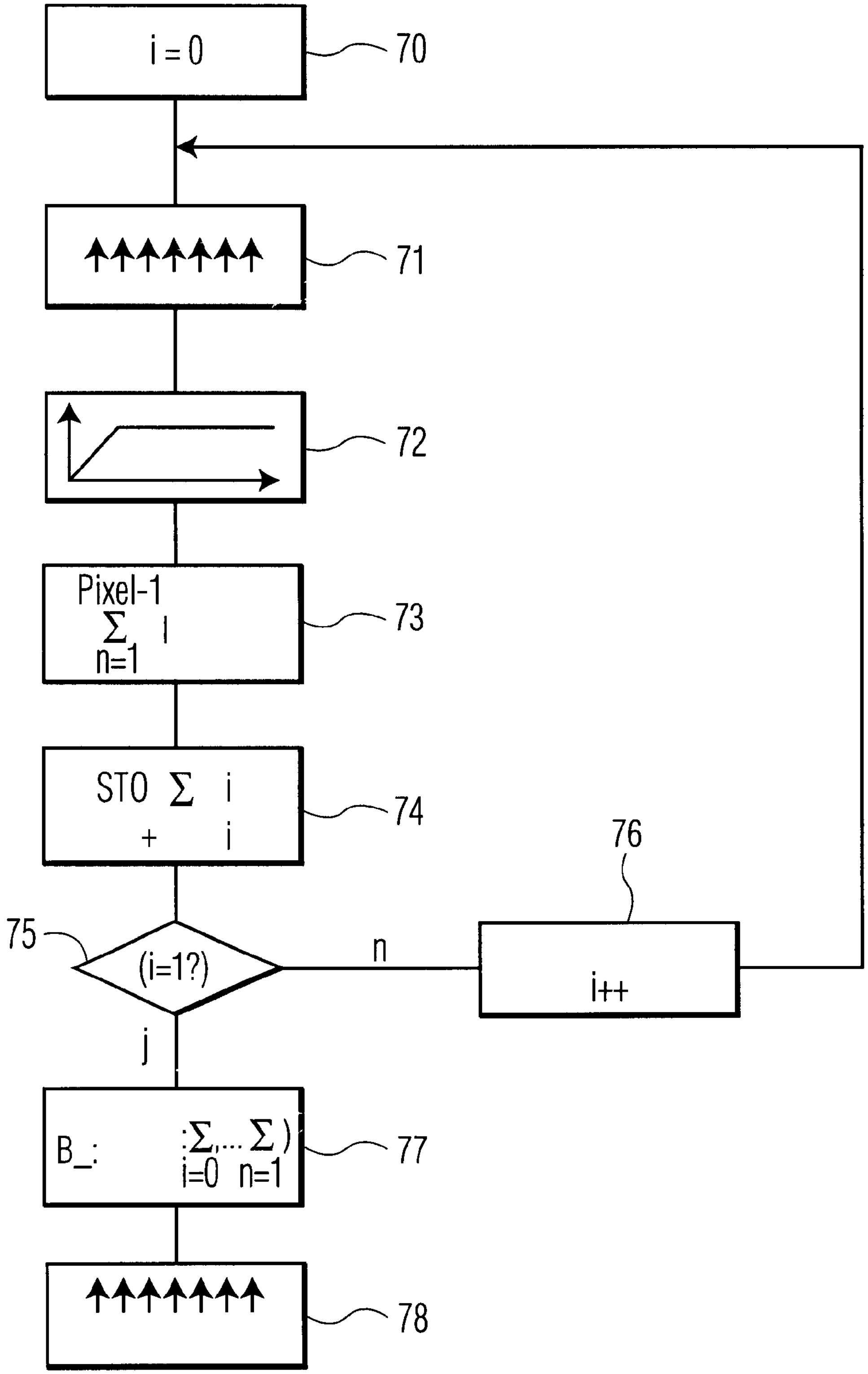
FIG. 15 shows a flow diagram for the determination of the optimum sampling phase.

The flow diagram for the phase detection is explained with reference to FIG. 15. The phase is set to an initial value of zero in step 70. The picture is sampled with this currently set phase in step 71. The high-pass filtering takes place in step 72. The high-pass-filtered pixel values of the picture are summed in step 73. This value is stored together with the current phase setting in step 74. A check is then made in interrogation 75 to see whether the end phase I has already been set. If that is not yet the case, the phase setting is modified. Steps 71 to 75 are then repeated. If it is ascertained in interrogation 75 that the final value with regard to the phase setting has been reached, then the optimum phase value is determined from the stored values for the different phase settings by searching for the maximum. This takes place in step 77. In step 78, the sampling phase is then set in such a way that the optimized sampling phase is always worked with. The following sampling operations then take place with the optimized phase setting.

Figure 16:
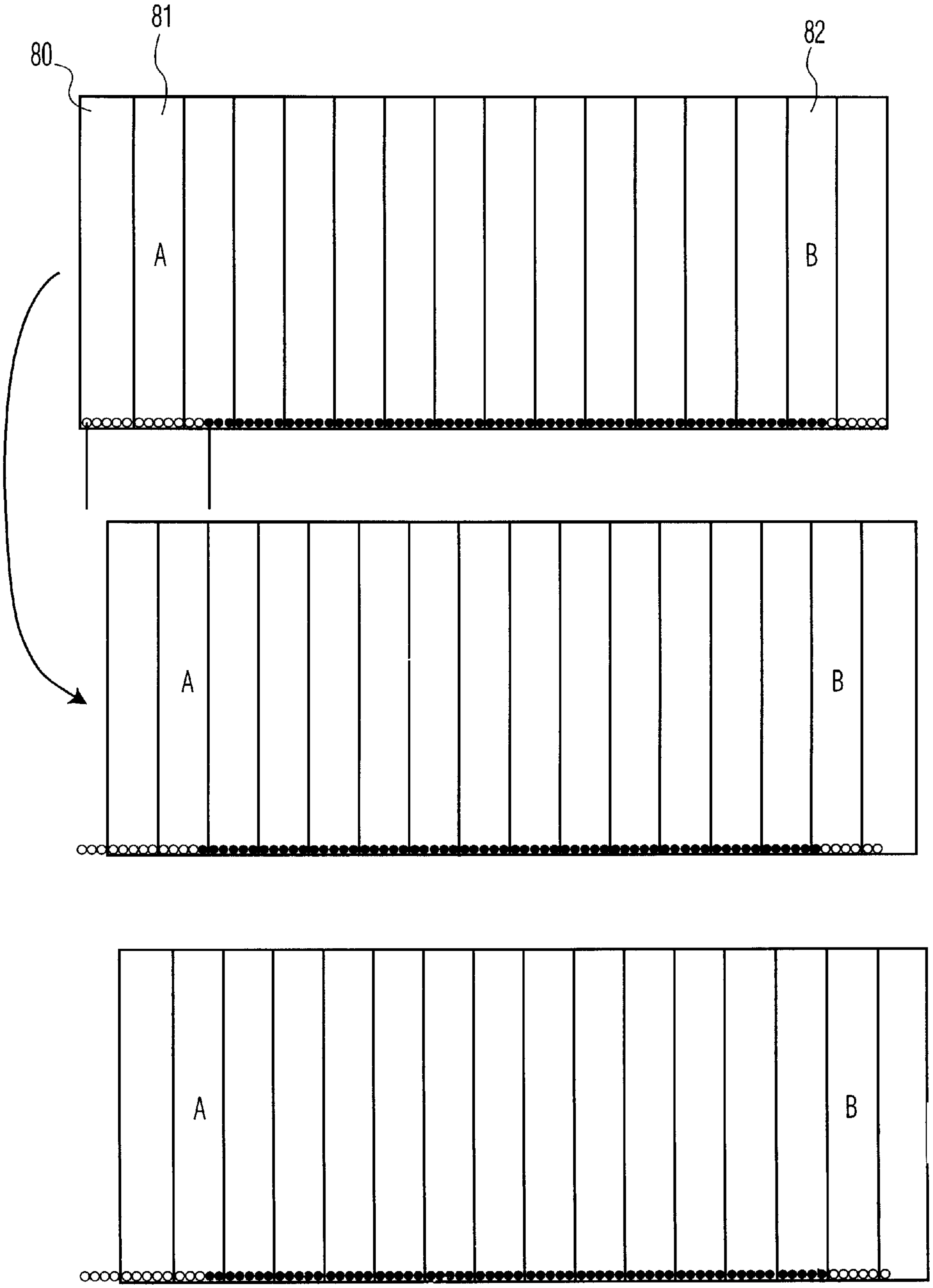
FIG. 16 shows an illustration for elucidating the principle behind the inventive position identification for the picture to be displayed.

The following text provides an additional explanation of the method by which the exact horizontal position of the active picture part can be exactly determined, according to the invention, relative to the entire picture line. This method is explained in more detail with reference to FIG. 16. It is useful for the clarification of the method if one knows that the graphics standards for the computer graphics cards such as VGA, EGA, CGA, etc. stipulate exactly only how many visible pixels are generated per line and how many visible lines are generated. However, the complete picture line definitely contains more pixels since, after all, the blanking interval for the line flyback can also be distributed to the left and right of the active line. It is up to the manufacturer of the graphics card to choose the size of the blanking intervals, that is to say how many inactive pixels occur in the video line. For the VGA standard, 640 active pixels have to be output per line. In actual fact, however, a picture line has a length of, for example, either 800, 808 or 816 pixels, depending on the graphics card manufacturer. Accordingly, the exact horizontal position of the picture is not always the same, depending on the graphics card manufacturer. In order to ascertain the exact position, the procedure is now as follows:

The entire picture, including blanking interval, is divided into 16 columns. The pixel values in the individual columns for a sampled picture are then added, as already explained previously in the case for the method for determining the optimum sampling frequency. The summation values obtained in this way are compared with a threshold value. The columns in which no active pixels are present and the columns in which active pixels are contained are virtually defined in this case. The threshold value is chosen accordingly. The number of those columns from the left-hand and right-hand edge of the picture in which no active pixels appeared is then determined. The columns are then progressively shifted relative to the sampled pixels in one direction by in each case one pixel. Each time the same picture is sampled again and the summation values for the new columns are determined. It is then determined, if e.g. the columns have been shifted to the right, whether the summation value of a section which previously was still below the threshold value now lies above the threshold value. If this is the case for the first time, one knows that an active pixel has now been forced into the column, and one can determine how many inactive pixels must be present at the left-hand edge of the picture. Specifically, this number results firstly from the number of shifting operations and secondly from the number of pixels per column and the number of columns at the left-hand edge of the picture with inactive pixels. This procedure is illustrated in FIG. 16. There is a coarse simplification in that only 5 pixels are illustrated per column. Under real conditions, substantially more pixels are provided here, for example 50 pixels per column. In the middle part of FIG. 16, an active pixel has for the first time been forced into the column designated by the letter A, after three shifting operations. The result of this is that the number of inactive pixels at the left-hand edge of the picture must correspond to exactly 3+2×5−1=12 pixels. In the next step, the number of inactive pixels at the right-hand edge of the picture is then determined. For this purpose, the columns are shifted further in the same direction. This is carried out until it can be discerned from the summation values for the columns that the originally last column with active pixels now no longer has any active pixel values. In the example shown in FIG. 15, that situation is already reached after four shifting operations. The result of this is that 5−4+1×5=6 inactive pixels must be present at the right-hand edge of the picture.

After the exact position of the picture has been automatically determined, exact centring of the active picture area for displaying the picture on the television screen can easily be performed.

The general formulae for the determination of the start of the active picture part with regard to the horizontal direction read:

Picture start position=number of shifting operations+(number of columns at the left-hand edge of the picture with inactive pixels×number of pixels per column)−1.

The general formula for the determination of the number of inactive pixels at the right-hand edge of the picture reads:

Number of inactive pixels at the right-hand edge of the picture=(number of pixels per column−number of shifting operations)+(number of columns with inactive pixels at the right-hand edge of the picture×number of pixels per column).

It emerges from this that the general formula for the end of the active picture area reads:

End of the active picture area=total number of pixels per line−number of inactive pixels at the right-hand edge of the picture.

As an alternative, the method can also be realized in such a way that first of all the number of inactive pixels at the right-hand edge of the picture is determined and then the number of inactive pixels at the left-hand edge of the picture. The method presented can likewise be realized in a simple manner with the aid of computer programs. A corresponding method can also easily be employed for ascertaining the vertical picture position.

The three methods presented can be used individually or else in combination. They can be started under the control of a user, for example by pressing a button on the remote control after the computer has been connected to the television set. The optimum values are stored and retained for the future. The computing unit or the computer can either be connected externally to the television set or be integrated in the television set.

What is claimed is:

1. A method for processing an input signal, comprising the steps of:

a) sampling the input signal using a first sampling frequency;

b) dividing the input signal into a plurality of sections and deriving a pixel summation value for each of the plurality of sections to form a first set of pixel summation values;

c) repeating the above steps using a second sampling frequency to form a second set of summation values; and d) determining a desired sampling frequency based on difference between the two sets of summation values.

2. The method of claim 1 wherein the desired sampling frequency is determined as a function of the number of maxima and minima in the difference between the two sets of summation values.

3. The method of claim 1 wherein the plurality of sections correspond to a plurality of columns.

4. The method of claim 1 wherein the second sampling frequency is either incremented or decremented from the first sampling frequency to ensure generation of one additional or one few pixel per picture line.

5. The method according to claims 2, wherein the desired sampling frequency is set to the second sampling frequency if it is not possible to determine a defined maximum in the difference between the two sets of summation values.

6. The method according to claim 2, wherein the desired sampling frequency is set to a value which corresponds to a number, decremented by a pixel value, of pixels per picture line, if it is not possible to determine a defined minimum in the difference between the two sets of summation values.

7. The method according to claim 2, wherein the desired sampling frequency is set to a value which corresponds to a number, incremented by a pixel value, of pixels per picture line if the number of maxima is greater than the number of minima.

8. The method according to claim 2, further comprising the step of determining the desired sampling frequency by repeating the above steps until it is no longer possible to determine a maximum or minimum.

9. The method according to claims 2, further comprising providing a table having a plurality of sampling frequencies which may be chosen for a sampling frequency.

10. The method according to claim 9, in which a next sampling frequency from the table is chosen for each case if analysis of picture disturbances reveals that a sampling frequency chosen previously has not led to desired number of maxima and minima in the difference of summation values.

11. The method according to claim 1, further comprising the step of high-pass filtering the input signal before or after sampling of the input signal.

12. A video signal sampling circuit comprising:

an analogue/digital converter in which an analogue picture signal is subjected to conversion at a chosen sampling frequency;

an divider for dividing the picture signal into a number of sections;

an adder for adding pixel values in the number of sections, an incrementing/decrementing unit in which a sampling frequency is incremented or decremented by a defined value, wherein the picture signal is sampled anew in said analogue/digital conversion unit, and the pixel values in the number of sections are added anew in said adder;

a calculation unit in which difference between summation values in the number of sections for the two sampling operations is formed, a counter which counts the maxima and minima in the distribution of the difference values, and an evaluation unit in which a corrected sampling frequency is set as a function of the number of maxima and minima to determine a corrected sampling frequency for the following sampling operations.

13. A signal processing method for a picture signal, comprising:

summing absolute values of the difference between two successive pixel values in at least a part of the picture, shifting the sampling phase progressively;

calculating anew sum of the pixel difference values is in each case for the part of the picture;

determining the maximum in the distribution of the summation values for the different sampling phases; and choosing an associated sampling phase value as optimum phase value for following sampling operation.

* * * * *